United States Patent
Yamamoto

(10) Patent No.: US 11,456,407 B2
(45) Date of Patent: Sep. 27, 2022

(54) VIBRATION WAVE MOTOR AND DRIVING APPARATUS

(71) Applicant: CANON KABUSHIKI KAISHA, Tokyo (JP)

(72) Inventor: Yasufumi Yamamoto, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 281 days.

(21) Appl. No.: 16/904,368

(22) Filed: Jun. 17, 2020

(65) Prior Publication Data
US 2020/0403139 A1 Dec. 24, 2020

(30) Foreign Application Priority Data

Jun. 20, 2019 (JP) .............................. JP2019-114941

(51) Int. Cl.
| | |
|---|---|
| *H01L 41/09* | (2006.01) |
| *G02B 7/04* | (2021.01) |
| *G03B 17/14* | (2021.01) |
| *H01L 41/04* | (2006.01) |
| *H04N 5/225* | (2006.01) |

(52) U.S. Cl.
CPC ................ *H01L 41/09* (2013.01); *G02B 7/04* (2013.01); *G03B 17/14* (2013.01); *H01L 41/04* (2013.01); *H04N 5/2254* (2013.01)

(58) Field of Classification Search
CPC ........ H02N 2/026; H02N 2/04; H02N 2/0055; H01L 41/09; H01L 41/04; G02B 7/04; G02B 7/08; G03B 17/14; H04N 5/2254
See application file for complete search history.

(56) References Cited

U.S. PATENT DOCUMENTS

| | | | | |
|---|---|---|---|---|
| 5,006,746 | A * | 4/1991 | Kasuga ................ | H02N 2/166 310/323.06 |
| 6,806,620 | B1 * | 10/2004 | Wischnewskiy ....... | H02N 2/004 310/323.16 |
| 10,247,902 | B2 * | 4/2019 | Noguchi ............. | H02N 2/0055 |
| 10,425,020 | B2 * | 9/2019 | Nishitani ............... | H02N 2/025 |

(Continued)

FOREIGN PATENT DOCUMENTS

| | | | |
|---|---|---|---|
| DE | 102010055848 A1 | 6/2012 | |
| JP | 2017099090 A * | 6/2017 | ........... B06B 1/0644 |

(Continued)

*Primary Examiner* — Vinh T Lam
(74) *Attorney, Agent, or Firm* — Canon U.S.A., Inc. IP Division

(57) ABSTRACT

A vibration wave motor includes a vibrator including a piezoelectric device and a vibration plate, and a friction member, wherein the vibrator and the friction member are pressurized to contact each other, and the vibrator is vibrated by the piezoelectric device to be moved relative to the friction member. The motor further includes a guide member that guides relative movement between the vibrator and the friction member, a fixing member that fixes the guide member at a first position and a second position in a direction of the relative movement between the vibrator and the friction member, and an attenuation member held between the friction member and the guide member in a pressure direction in which the vibrator and the friction member are pressurized to contact each other at a location between the first position and the second position.

16 Claims, 8 Drawing Sheets

(56) References Cited

U.S. PATENT DOCUMENTS

| | | | | |
|---|---|---|---|---|
| 10,938,326 B2* | 3/2021 | Takai | ................ | G02B 7/08 |
| 11,038,439 B2* | 6/2021 | Tomura | ................ | H02N 2/026 |
| 2017/0315324 A1* | 11/2017 | Noguchi | ................ | H02N 2/026 |
| 2018/0175747 A1* | 6/2018 | Tomura | ................ | H02N 2/0055 |
| 2018/0254718 A1* | 9/2018 | Takai | ................ | H02N 2/001 |
| 2019/0181777 A1* | 6/2019 | Nakabayashi | ................ | H02N 2/026 |
| 2019/0393807 A1* | 12/2019 | Oikawa | ................ | H02N 2/026 |
| 2020/0136528 A1* | 4/2020 | Yamamoto | ................ | G02B 7/04 |

FOREIGN PATENT DOCUMENTS

| | | | | |
|---|---|---|---|---|
| JP | 2017-198925 A | 11/2017 | | |
| JP | 2018-098933 A | 6/2018 | | |
| JP | 6700945 B2 * | 5/2020 | ................ | G02B 7/04 |

* cited by examiner

VIBRATION WAVE MOTOR AND DRIVING APPARATUS

BACKGROUND OF THE DISCLOSURE

Field of the Disclosure

The present disclosure relates to a vibration wave motor and a driving apparatus including a vibration wave motor.

Description of the Related Art

Known vibration wave motors obtain motor drive power using a frictional force generated between a vibrator serving as a driving source and a friction member when the vibrator is pressurized to contact the friction member to generate vibration. Japanese Patent Laid-Open No. 2017-198925 proposes a configuration in which the friction member and a guide member in the driving direction, which receives a pressure from the vibrator, are supported at opposite ends in the driving direction in order to reduce both the size of the entire vibration wave motor unit and the number of parts that transmit the vibration from the friction member.

However, with the configuration disclosed in Japanese Patent Laid-Open No. 2017-198925, in particular, if the driving distance of the vibration wave motor is increased, the distance between the portions that support the friction member and the guide member in the driving direction is increased, making warping of the components likely to occur. Furthermore, the long distance between the supporting portions causes the resonant mode of the friction member to shift to a lower frequency, causing unwanted vibration in an audible range, which in turn cause abnormal noise.

SUMMARY OF THE DISCLOSURE

According to an aspect of the present disclosure, there is provided a vibration wave motor including a vibrator including a piezoelectric device and a vibration plate; a friction member; a guide member configured to guide relative movement between the vibrator and the friction member; a fixing member configured to fix the guide member at a first position and a second position in a direction of the relative movement between the vibrator and the friction member; and an attenuation member held between the friction member and the guide member in a pressure direction in which the vibrator and the friction member are pressurized to contact each other at a location between the first position and the second position. The piezoelectric device is arranged to vibrate the vibration plate to move in the pressure direction relative to the friction member.

According to another aspect of the present disclosure, there is provided a driving apparatus including a vibration wave motor including a vibrator including a piezoelectric device and a vibration plate; a friction member; a guide member configured to guide relative movement between the vibrator and the friction member; a fixing member configured to fix the guide member at a first position and a second position in a direction of the relative movement between the vibrator and the friction member; and an attenuation member held between the friction member and the guide member in a pressure direction in which the vibrator and the friction member are pressurized to contact each other at a location between the first position and the second position, wherein the piezoelectric device is arranged to vibrate the vibration plate to move in the pressure direction relative to the friction member; and a driven object arranged to move with relative movement of the vibrator and the friction member.

Further features and aspects of the present disclosure will become apparent from the following description of example embodiments with reference to the attached drawings.

DESCRIPTION OF THE EMBODIMENTS

First Example Embodiment

Figure 1A:
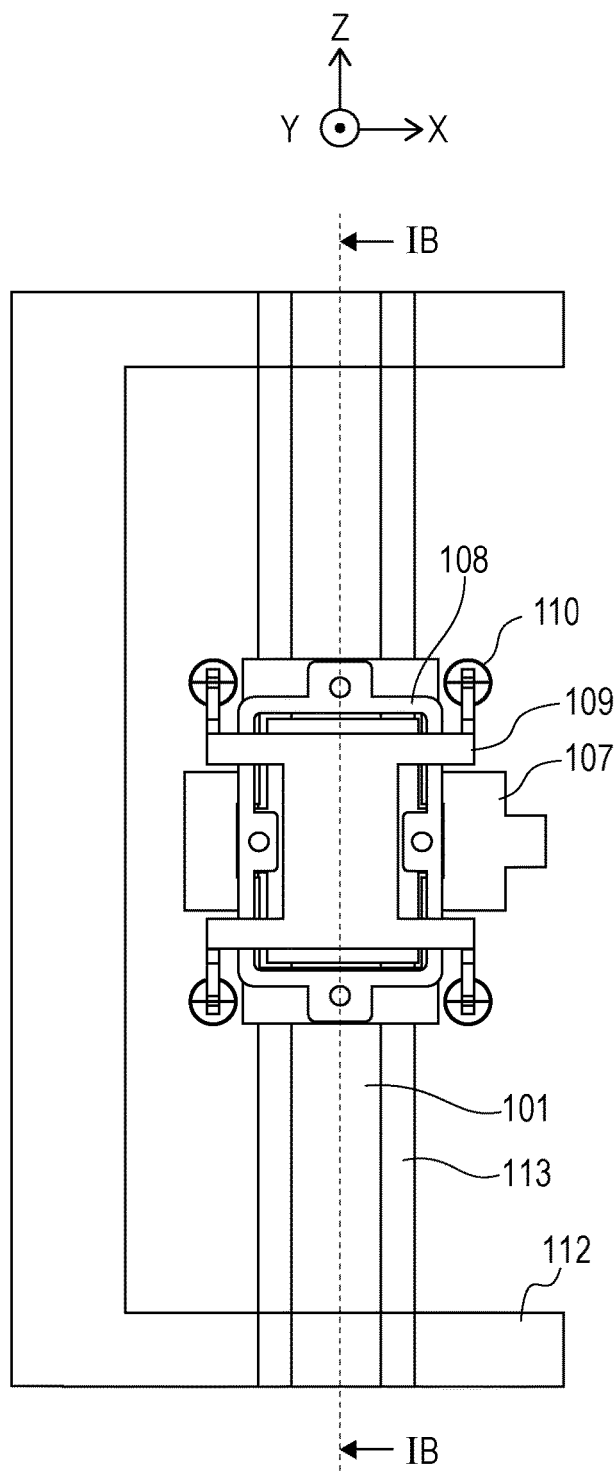
FIGS. 1A and 1B are diagrams illustrating an example configuration of a vibration wave motor according to a first example embodiment of the present disclosure.
Figure 1B:
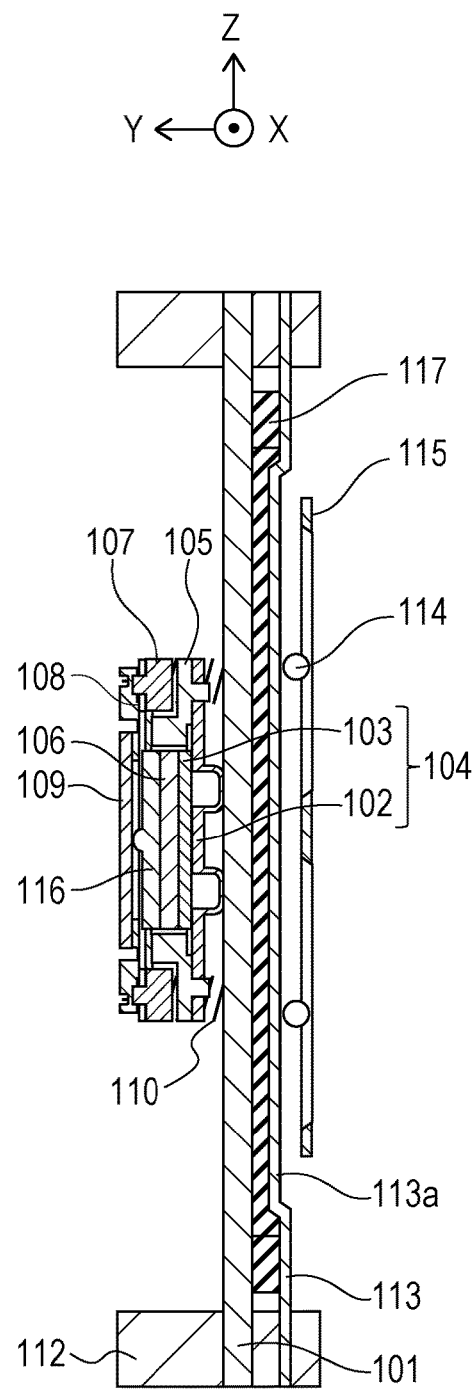

FIGS. 1A and 1B are diagrams illustrating the configuration of a vibration wave motor 3 according to a first embodiment of the present disclosure. FIG. 1A is a cross-sectional view of the vibration wave motor 3 viewed from a vibrator 104 side in the Y-axis direction, and FIG. 1B is a cross-sectional view of the vibration wave motor 3 taken along line IB-IB in FIG. 1A.

The vibrator 104 includes a vibration plate 102 that is a rectangular flat plate having an elastic property and having two protrusions and a piezoelectric device 103 firmly bonded to the surface of the flat plate not having the protrusions with an adhesive or the like. A flexible substrate (not illustrated) for power feeding is fixed to the piezoelectric device 103. A voltage is applied to the piezoelectric device 103 to excite an ultrasonic vibration. The two protrusions disposed on the flat plate are in contact with a friction member 101. When the ultrasonic vibration is excited in the vibrator 104, the vibrator 104 generates two kinds of standing waves and moves relative to the friction member 101 owing to a substantially elliptical motion generated at the ends of the two protrusions. A direction in which the vibrator 104 and the friction member 101 move relative to each other is hereinafter referred to as "driving direction", which is indicated as the Z-axis direction in the drawings.

A vibrator holding member 105 holds the vibrator 104 by holding arms extending from the flat plate of the vibration plate 102. The vibrator holding member 105 and the vibration plate 102 are fixed to each other with a known adhesive or the like. However, any fixing method may be used.

A movable frame member 107 is joined to the vibrator holding member 105 via a thin sheet metal 108. The relative movement of the vibrator holding member 105 and the movable frame member 107 in the driving direction is restricted more than the relative movement in the direction of the pressure. This configuration reduces or eliminates backlash of the vibrator holding member 105 and the movable frame member 107 in the driving direction to allow the vibrator 104 to be pressurized to contact the friction member 101, to be described later. Any configuration that provides the same advantageous effects as those of the thin sheet metal 108 may be used to join the movable frame member 107 and vibrator holding member 105.

The friction member 101 is fixed to a fixing frame member 112 at opposite ends in the driving direction with screws or the like together with a fixed-side rail member 113 included in a guide mechanism that guides the relative movement of the vibrator 104 and the friction member 101. In the present embodiment, the friction member 101, the fixing frame member 112, and the fixed-side rail member 113 are not moved even if an ultrasonic vibration is excited in the vibrator 104.

Springs 110, which are extension springs, are disposed at four locations around the vibrator 104. One end of each of the four springs 110 is supported by a pressure plate 109, and the other end is supported by a moving-side rail member 115. This generates a pressure that brings the vibrator 104 and the friction member 101 into pressure-contact with each other.

The pressure plate 109 is in contact with an elastic-member attaching member 116 and transmits the pressure of the springs 110 to the elastic-member attaching member 116. An elastic member 106 is disposed between the elastic-member attaching member 116 and the piezoelectric device 103. The elastic-member attaching member 116 and the elastic member 106 prevent the direct contact between the pressure plate 109 and the piezoelectric device 103, thereby preventing damage to the piezoelectric device 103. One or both of the elastic-member attaching member 116 and the elastic member 106 may be omitted. The four springs 110 may not be used to apply pressure. The kind of the springs is not limited to the extension spring.

The direction of the pressure in which the vibrator 104 and the friction member 101 are pressurized to contact each other is indicated as the Y-axis direction in the drawings.

The moving-side rail member 115 includes two moving-side guide portions 115a, which are substantially V-shaped grooves, in each of which a rolling ball 114 is disposed. The fixed-side rail member 113 also includes a fixing-side guide portion 113a, which is a substantially V-shaped groove, as a protruding portion protruding toward an attenuation member 117. The rolling balls 114 are held between the fixing-side guide portion 113a of the fixed-side rail member 113 and the moving-side guide portions 115a of the moving-side rail member 115. The relative movement of the vibrator 104 and the friction member 101 is guided by the guide mechanism constituted by the fixing-side guide portion 113a, the rolling balls 114, and the moving-side guide portions 115a. Although the movable frame member 107 and the moving-side rail member 115 are fixed together using screws (not illustrated), any fixing method may be used.

The attenuation member 117 is held by the friction member 101 and the fixed-side rail member 113 in the pressure direction. The attenuation member 117 has elasticity and generates an urging force due to an elastic reaction against the friction member 101 and the fixed-side rail member 113 by being held by the friction member 101 and the fixed-side rail member 113. This configuration allows reduction of the warp of the friction member 101 and the fixed-side rail member 113 and reduction of the unwanted vibration of the friction member 101.

The movable frame member 107 includes a driving-power extracting unit, so that the driving power generated by the vibrator 104 can be transmitted to a driven object connected to the driving-power extracting unit to move the driven object in the driving direction.

Figure 2:
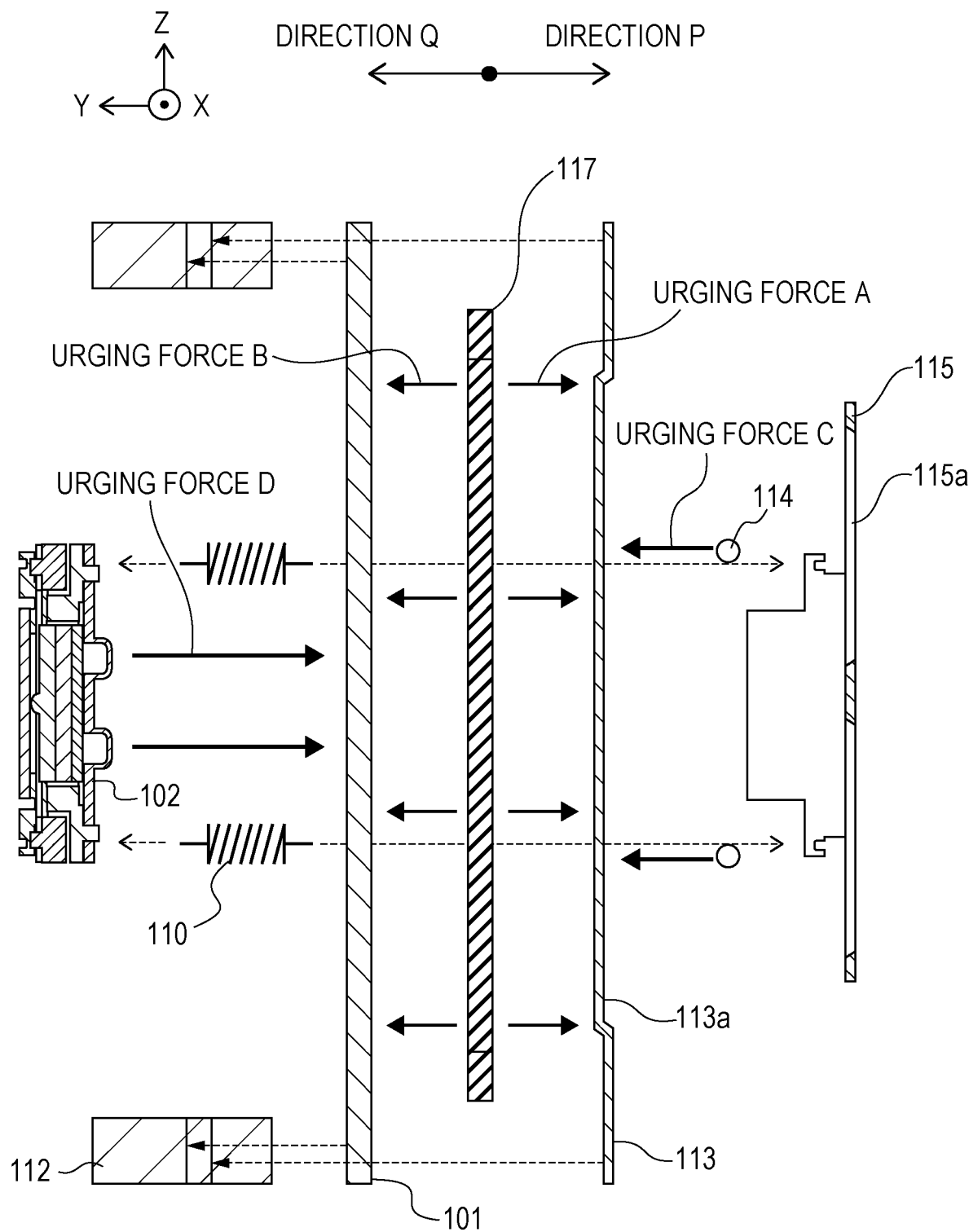
FIG. 2 is a diagram illustrating the relationship between the urging forces of the vibration wave motor according to the first example embodiment of the present disclosure.

Next, the relationship between the urging forces of the vibration wave motor 3 will be described with reference to FIG. 2. FIG. 2 is an expanded cross-sectional view viewed from the same viewpoint as in FIG. 1B, illustrating the relationship between the urging forces of the vibration wave motor 3.

As described above, the friction member 101 is fixed to the fixing frame member 112 at the opposite ends in the driving direction (the Z-axis direction). The fixed-side rail member 113 is also fixed to the fixing frame member 112 at the opposite ends in the driving direction (the Z-axis direction).

The friction member 101 and the fixed-side rail member 113 fixed to the fixing frame member 112 only at the opposite ends in the driving direction (the Z-axis direction) is clamped from the opposite sides in the Y-axis direction by an urging force C and an urging force D of the springs 110. The friction member 101 receives the urging force D in a direction P (a first direction) parallel to the pressure direction via the vibrator 104. The fixed-side rail member 113 receives the urging force C in a direction Q (a second direction) opposite to the direction P parallel to the pressure direction via the rolling balls 114. For that reason, in particular, in a configuration in which the friction member 101 and the fixed-side rail member 113 are increased in the driving direction to increase the driving distance of the vibration wave motor 3, the friction member 101 and the fixed-side rail member 113 tend to warp at the center.

In the present embodiment, the attenuation member 117 is held with elastic deformation between the friction member 101 and the fixed-side rail member 113 in the pressure direction. For that reason, the friction member 101 is given an urging force B in the direction Q from the attenuation member 117, and the fixed-side rail member 113 is given an urging force A in the direction P from the attenuation member 117. For the friction member 101, the urging force B of the attenuation member 117 acts to cancel the urging force D of the springs 110, and for the fixed-side rail member 113, the urging force A of the attenuation member 117 acts to cancel the urging force C of the springs 110. The warp of the friction member 101 and the fixed-side rail member 113 is reduced owing to the relationship between the urging forces. The relationship of the relative position of the attenuation member 117 and the friction member 101 does not change with a positional change between the configuration from the vibrator 104 to the movable frame member 107 and the friction member 101. Therefore, the positions of the urging forces generated in the attenuation member 117 are kept at predetermined positions relative to the friction member 101 and the fixed-side rail member 113 regardless of the positional change of the vibrator 104 and the friction member 101 along with the relative displacement of the vibrator 104 and the friction member 101.

In a configuration in which the friction member 101 is long, the frequency of the resonant mode the friction member 101 shifts to a lower frequency area as compared with a configuration in which the friction member 101 is short. This makes an unwanted vibration caused by the resonant mode of the friction member 101 prone to enter an audible range, easily causing uncomfortable abnormal noise for the user.

However, in the configuration of the present embodiment, the attenuation member 117 comes into contact with the friction member 101 while applying the urging force B. This allows the vibration of the friction member 101 to be attenuated by the vibration attenuation characteristic of the attenuation member 117, reducing the occurrence of abnormal noise in the friction member 101.

To stabilize the pressure-contact state of the friction member 101 and the vibration plate 102, the fixing frame member 112 with which the friction member 101 is fixed may be made of a rigid material. In contrast, the attenuation member 117 may be made of a material with a higher vibration attenuation characteristic (for example, with a higher vibration attenuation rate) than that of the fixing frame member 112 to attenuate the vibration. Examples of the material of the attenuation member 117 include foamed polyurethane, polyethylene, butyl rubber, and felt.

Figure 3:
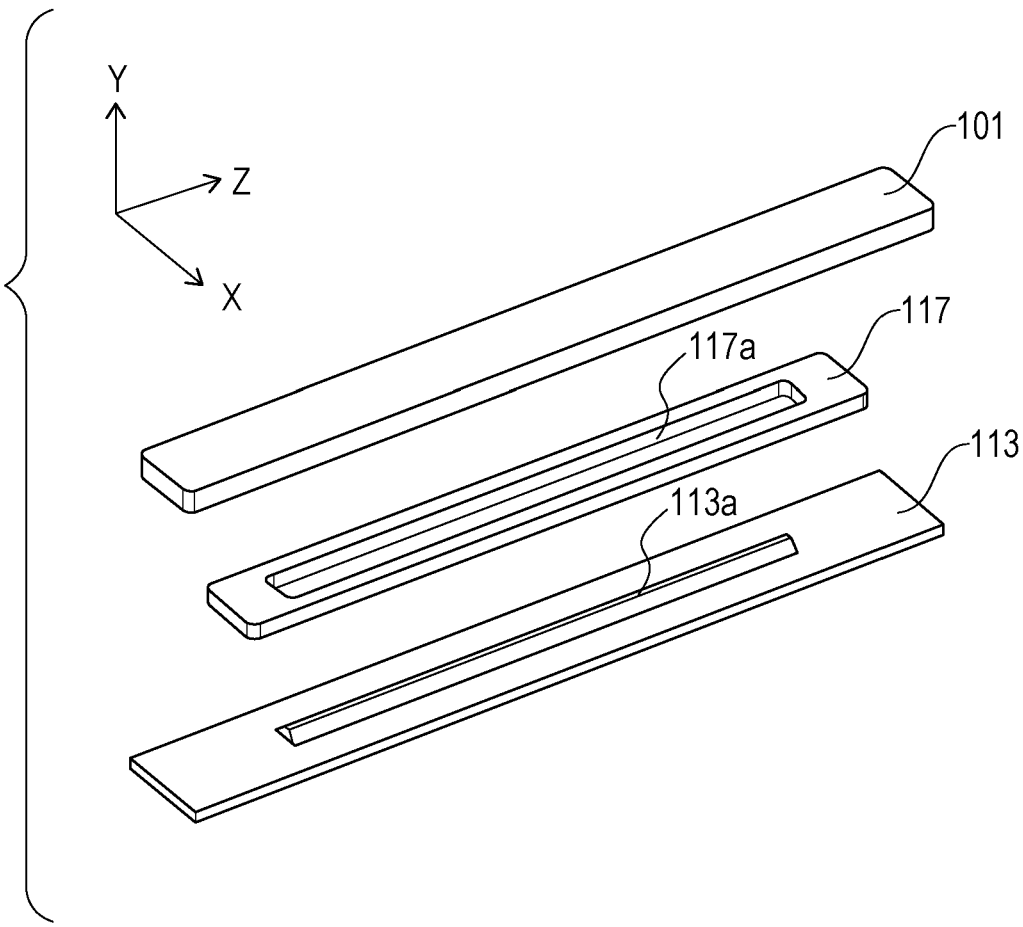
FIG. 3 is an expanded perspective view of the vicinity of the friction member of the vibration wave motor according to the first example embodiment of the present disclosure.

Next, the details of the friction member 101, the fixed-side rail member 113, and the attenuation member 117 will be described with reference to FIG. 3. FIG. 3 is an expanded perspective view of the vicinity of the friction member 101.

The attenuation member 117 has an opening 117a in the rectangle as illustrated in FIG. 3. The fixing-side guide portion 113a of the fixed-side rail member 113 is fitted in the opening 117a. This suppresses an increase in the thickness of the fixed-side rail member 113 due to the fixing-side guide portion 113a due to overlapping of components in the Y-axis direction even if the attenuation member 117 is held in close-contact with the fixed-side rail member 113.

The urging forces (the urging force A and the urging force B) generated in the attenuation member 117 may balance with the urging force C and the urging force D of the springs 110. In the present embodiment, the urging force A and the urging force B generated in the attenuation member 117 are adjusted by providing the opening 117a in the attenuation member 117 so as to substantially balance with the urging force C and the urging force D. Even if the urging forces A and B and the urging forces C and D are not balanced, the urging force generated in the fixing-side guide portion 113a need only be half or less of the urging force A of the attenuation member 117 and the urging force C of the springs 110.

Figure 4A:
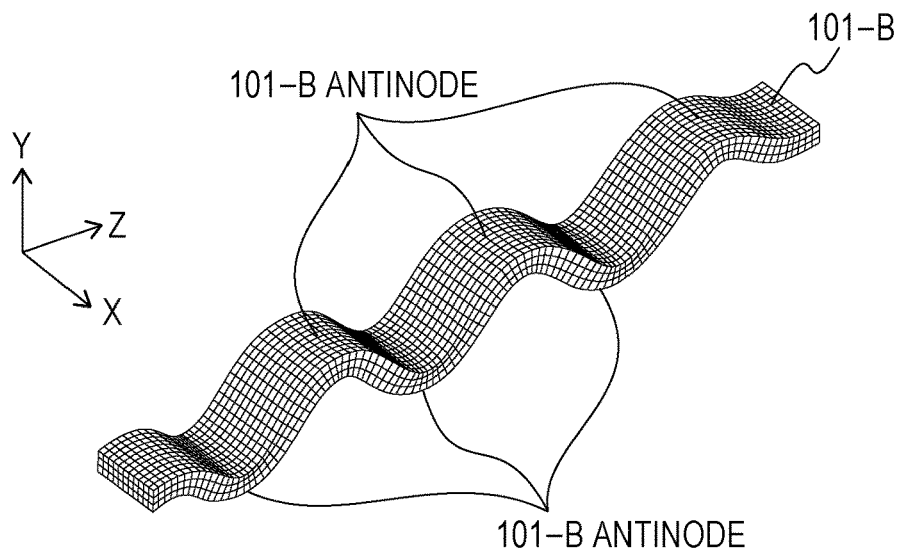
FIGS. 4A to 4C are diagrams illustrating the resonant modes of the vibration wave motor according to the first example embodiment of the present disclosure.
Figure 4B:
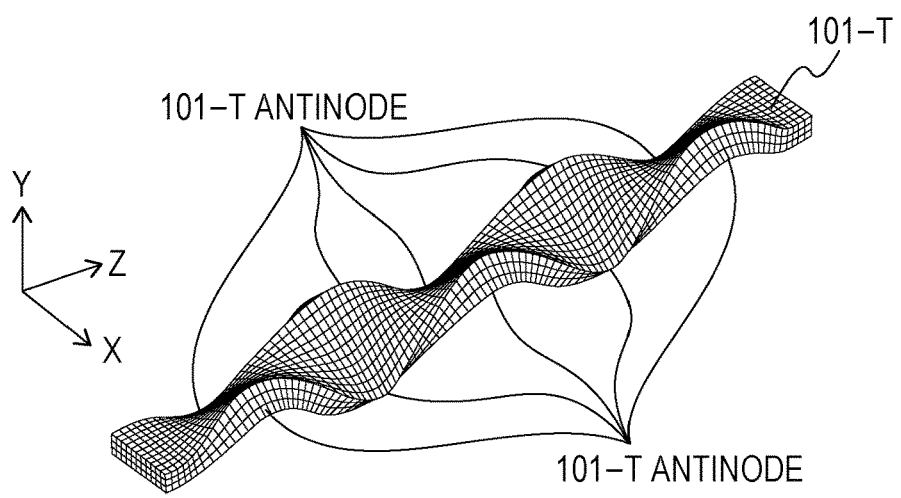
Figure 4C:
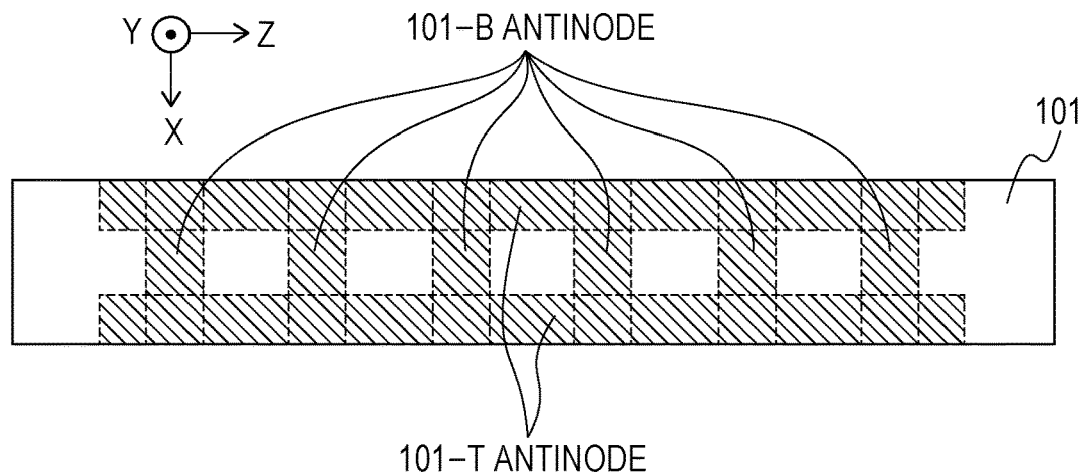

Next, the vibration generated in the friction member 101 will be described with reference to FIGS. 4A to 4C. FIGS. 4A to 4C are diagrams illustrating the resonant modes of the friction member 101. FIG. 4A illustrates the resonant mode of an out-of-plane vibration, FIG. 4B illustrates the resonant mode of a torsional vibration, and FIG. 4C schematically illustrates the antinodes of the out-of-plane vibration and the torsional vibration.

Reference sign 101-B in FIG. 4A denotes one of the resonant modes of the out-of-plane bending vibration of the friction member 101. This vibration is in a resonant mode in which the vibration is displaced in the direction in which the friction member 101 and the vibrator 104 come into contact and in which the vibration is transmitted to make abnormal noise prone to occur. The antinodes of the largest amplitude in the resonant mode of the out-of-plane bending vibration are discretely generated in the Z-axis direction, as indicated by antinodes 101-B. Bringing the attenuation member 117 into contact at the antinodes of the amplitude of the resonant mode provides a high vibration attenuation effect. However, the resonant modes of the out-of-plane bending vibration include, in addition to the resonant mode having six antinodes of the amplitude illustrated in FIG. 4A, other myriad resonant modes with different numbers of antinodes of the amplitude, and therefore the antinodes of the out-of-plane bending vibration can be generated in almost the entire region excluding the opposite ends in the Z-axis direction.

Reference sign 101-T in FIG. 4B denotes one of the resonant modes of the torsional vibration of the friction member 101. This torsional vibration is also in a resonant mode having a displacement component in the direction of contact between the friction member 101 and the vibrator 104, in which the vibration is transmitted to make abnormal noise to prone to occur. The antinodes of the largest amplitude in the resonant mode of the torsional vibration are generated at the edges in the X-axis direction, as indicated by the antinodes 101-T. The resonant modes of the torsional vibration include, in addition to the resonant mode having five antinodes at each edge in the X-axis direction illustrated in FIG. 4B, other myriad resonant modes with different numbers of antinodes of the amplitude. However, the antinodes of the amplitudes in the resonant modes are always generated at the edges in the X-axis direction.

The antinodes 101-B and antinodes 101-T indicated by the hatched lines in FIG. 4C are the antinodes of the amplitude of the resonant mode described above illustrated on the friction member 101.

Next, the disposition of the attenuation member 117 on the antinodes of the amplitude of the resonant mode of the friction member 101 will be described with reference to FIGS. 5A to 5E.

FIGS. 5A to 5E illustrate the disposition of the attenuation member 117 on the projection of the friction member 101 viewed from the Y-axis. Each of FIGS. 5A to 5E illustrates an example of the shape of the attenuation member 117 for attenuating the vibration of the friction member 101.

Figure 5A:
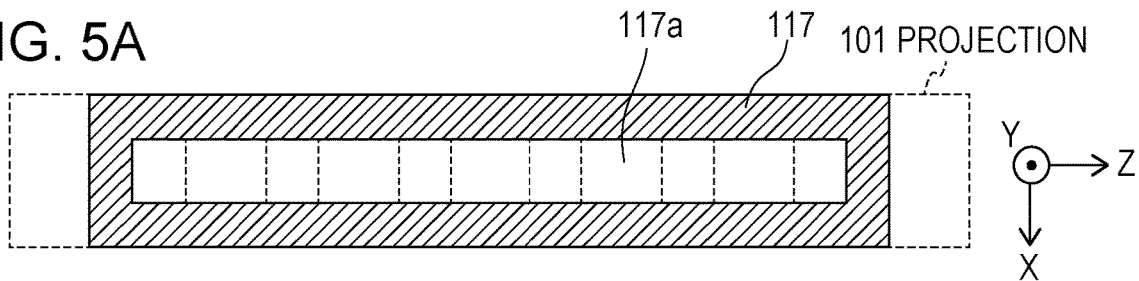
FIGS. 5A to 5E are diagrams illustrating examples of the shape of the attenuation member of the vibration wave motor according to the first example embodiment of the present disclosure.

FIG. 5A illustrates the shape of the attenuation member 117 illustrated in FIG. 3. As illustrated in FIG. 5A, the attenuation member 117 is disposed so as to overlap with substantially the entire area of the antinodes 101-T of the amplitude of the torsional vibration. Also for the antinodes 101-B of the amplitude of the bending vibration, the attenuation member 117 is disposed so as to overlap therewith in the range of half or more in the with X-axis direction. This shape and disposition of the attenuation member 117 allows the attenuation member 117 to be brought into contact with the friction member 101 using an urging force at the portions where the vibration of the friction member 101 is largest to efficiently attenuate the vibration of the friction member 101.

Figure 5B:
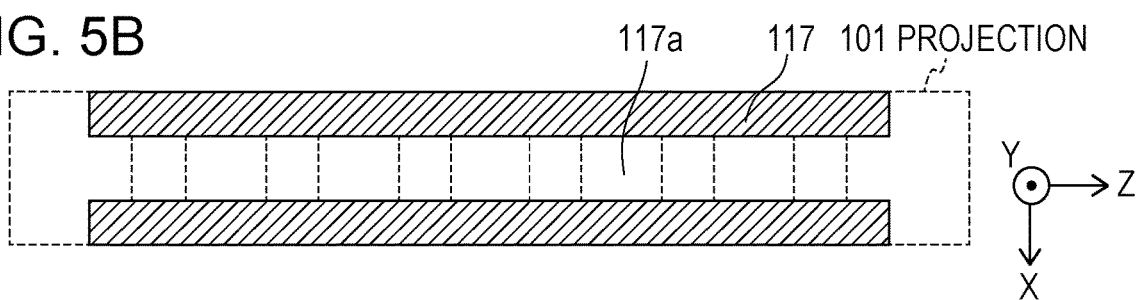

FIG. 5B illustrates an example in which the attenuation member 117 is disposed separately in the Y-axis direction. Also in the example of FIG. 5B, the attenuation member 117 is disposed so as to overlap with half or more of the antinodes 101-T of the amplitude of the torsional vibration and the antinodes 110-B of the amplitude of the bending vibration, as in FIG. 5A. This allows the vibration of the friction member 101 to be efficiently attenuated as with the shape and disposition of the attenuation member 117 illustrated in FIG. 5A.

Figure 5C:
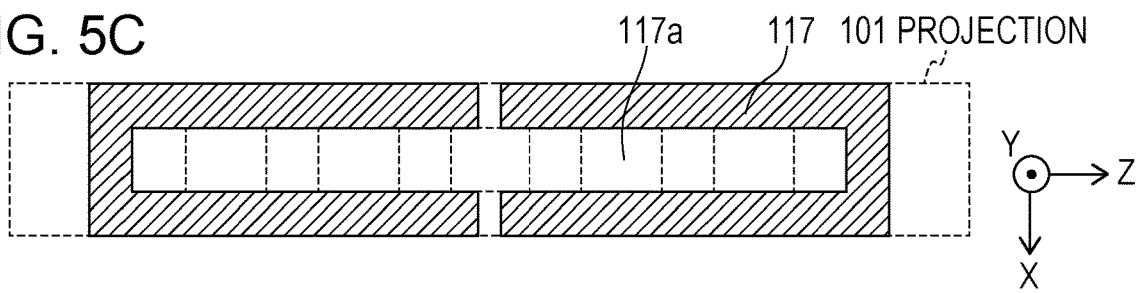

FIG. 5C illustrates an example in which the attenuation member 117 is separately disposed in the Z-axis direction. Also in the example of FIG. 5C, the attenuation member 117 is disposed so as to overlap with half or more of the antinodes 101-T of the amplitude of the torsional vibration and the antinodes 110-B of the amplitude of the bending vibration, as in FIG. 5B. This allows the vibration of the friction member 101 to be efficiently attenuated as with the shape and disposition of the attenuation member 117 illustrated in FIG. 5A.

Figure 5D:
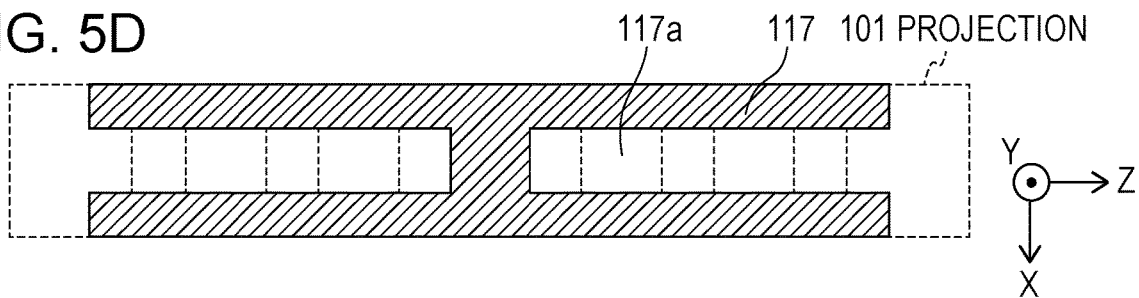

FIG. 5D illustrates a configuration in which the attenuation member 117 has a connecting portion in the X-axis direction at the center in the Z-axis direction. Also in the example of FIG. 5D, the attenuation member 117 is disposed so as to overlap with half or more of the antinodes 101-T of the amplitude of the torsional vibration and the antinodes 110-B of the amplitude of the bending vibration, as in FIG. 5B. However, the attenuation member 117 of this configuration interferes with the structure of the fixing-side guide portion 113a of the fixed-side rail member 113 in FIG. 3. For that reason, for the attenuation member 117 in FIG. 5D, the fixing-side guide portion 113a of the fixed-side rail member 113 is divided into two in the Z-axis direction, and the attenuation member 117 is disposed so that the divided region and the connecting portion of the attenuation member 117 overlap with each other to avoid the interference. In the case of the configuration in which the fixing-side guide portion 113a is divided into two in the Z-axis direction, the rolling ball 114 is clamped in each of the divided fixing-side guide portions 113a.

Figure 5E:
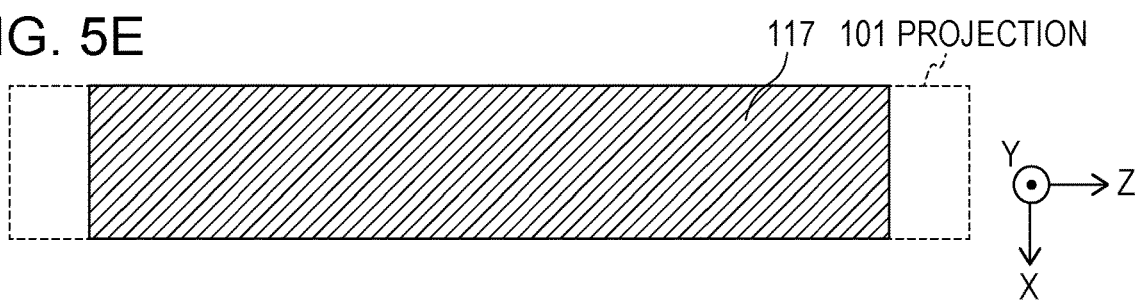

FIG. 5E illustrates an example in which the attenuation member 117 has not the opening 117a in the rectangle. Also in the example of FIG. 5E, the attenuation member 117 is disposed so as to overlap with half or more of the antinodes 101-T of the amplitude of the torsional vibration and the antinodes 110-B of the amplitude of the bending vibration, as in FIG. 5B. With this configuration, the urging force generated in the attenuation member 117 cannot be adjusted by adjusting the shape of the opening 117a. However, the vibration of the friction member 101 can be effectively attenuated as compared with a configuration in which the attenuation member 117 is not clamped between the friction member 101 and the fixed-side rail member 113 in the pressure direction.

Figure 6A:
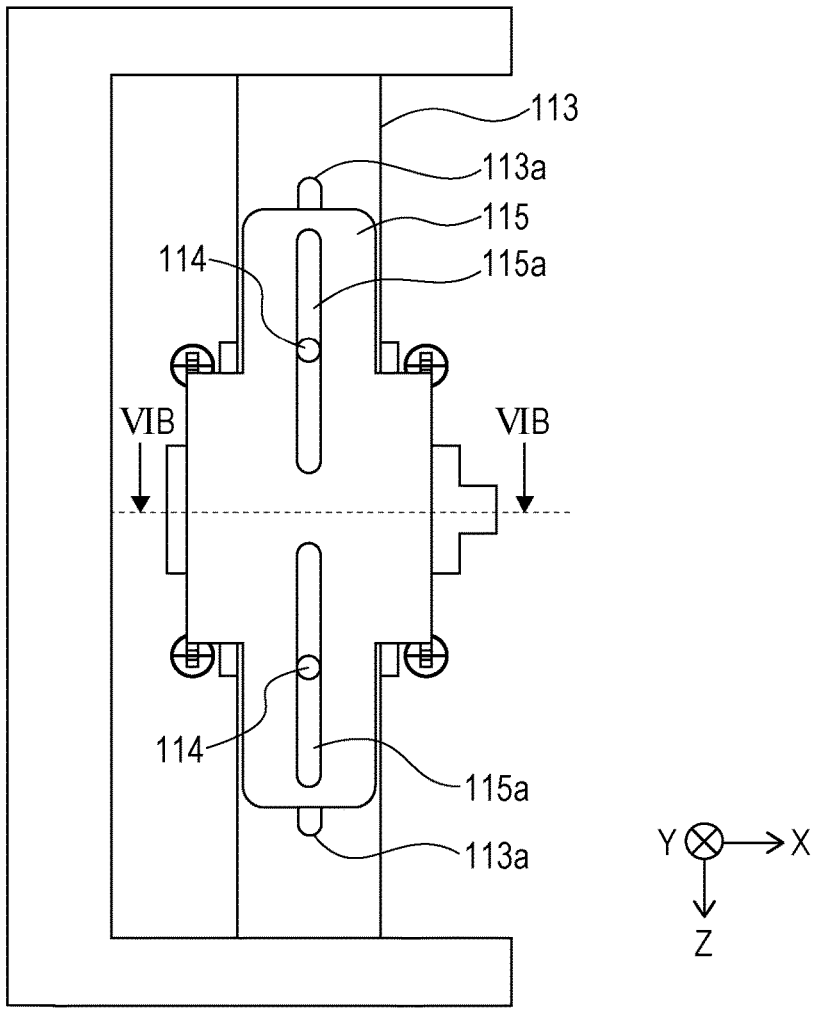
FIGS. 6A to 6C are diagrams illustrating the positional relationship between the attenuation member and the fixing-side guide portion.
Figure 6B:
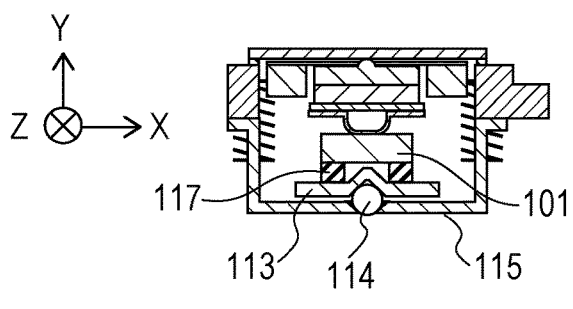
Figure 6C:
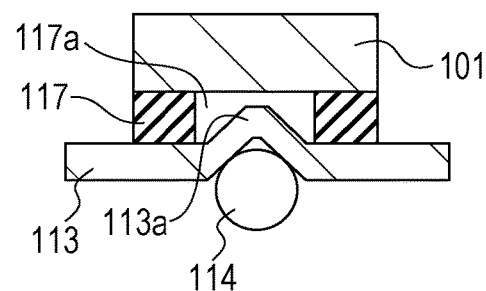

Next, the advantageous effect of a size reduction of the vibration wave motor will be described with reference to FIGS. 6A to 6C. FIGS. 6A to 6C are diagrams illustrating the positional relationship between the attenuation member 117 and the fixing-side guide portion 113a. FIG. 6A is a diagram of the vibration wave motor 3 viewed from the friction member 101 side in the Y-axis direction, that is, from the viewpoint opposite to that of FIG. 1A. FIG. 6B is a cross-sectional view taken along line VIB-VIB in FIG. 6A, and FIG. 6C is an enlarged diagram of FIG. 6B.

As illustrated in FIG. 6A, the fixing-side guide portion 113a of the fixed-side rail member 113 and the two moving-side guide portions 115a of the moving-side rail member 115 extend on the same straight line in the Z-axis direction. As illustrated in FIG. 6C, the fixing-side guide portion 113a protrudes in the Y-axis direction into the opening 117a of the attenuation member 117. This prevents an increase in the size of the vibration wave motor 3 due to overlapping of components in the Y-axis direction.

In the present embodiment, the attenuation member 117 is clamped between the friction member 101 and the fixed-side rail member 113 in the pressure direction, thereby attenuating the unwanted vibration of the friction member 101 which causes the warping of the fixed-side rail member 113 and abnormal noise, as described above. Furthermore, the fixing-side guide portion 113a, which is part of the guide mechanism, and the attenuation member 117 overlap in the direction of relative movement and the direction perpendicular to the pressure direction (the X-axis direction). This prevents an increase in the size of the vibration wave motor 3 due to overlapping of components in the Y-axis direction.

Second Example Embodiment

The first embodiment describes a configuration in which the friction member 101 and the guide mechanism constituted by the fixing-side guide portion 113a, the rolling balls 114, and the moving-side guide portions 115a overlap in the pressure direction. In the case of the configuration of the first embodiment, the friction member 101 and the vibrator 104 are rotatable about the guide mechanism (the Z-axis). In contrast, the present embodiment describes a configuration in which the rotation of the friction member 101 and the vibrator 104 about the Z-axis is restricted.

A detailed description of the same parts and configuration as those of the first example embodiment will be omitted.

Figure 7A:
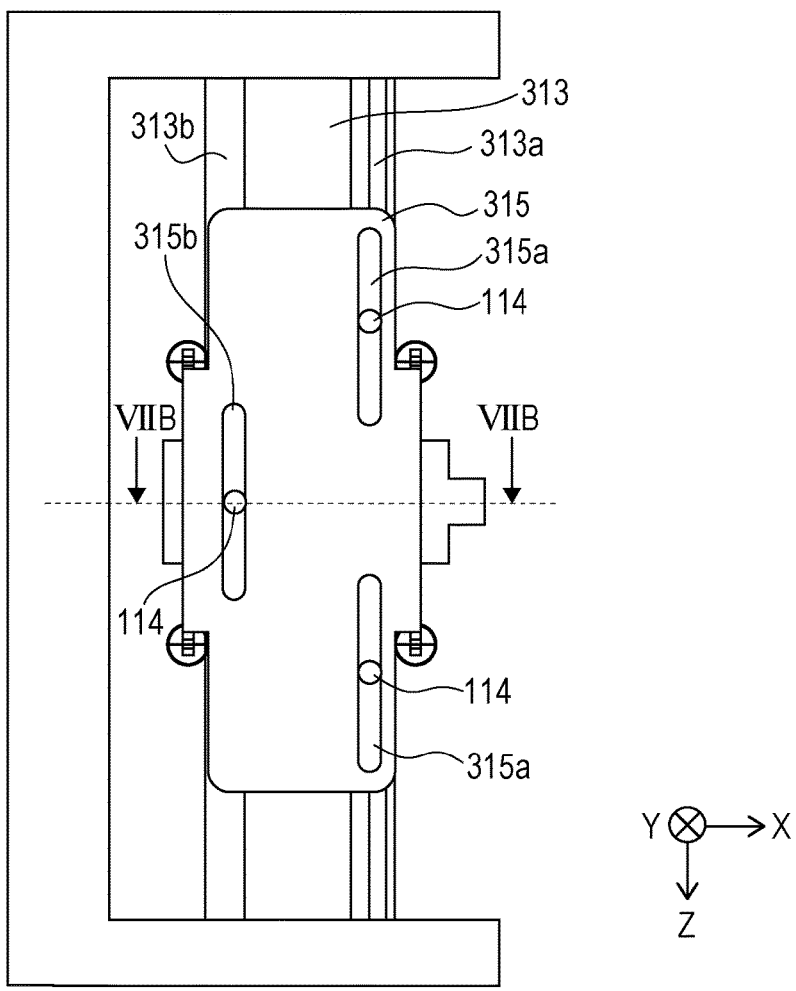
FIGS. 7A to 7C are diagrams illustrating the positional relationship between the attenuation member and the fixing-side guide portions of the vibration wave motor according to the first example embodiment of the present disclosure.
Figure 7B:
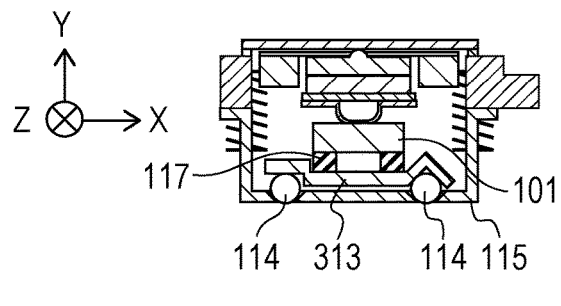
Figure 7C:
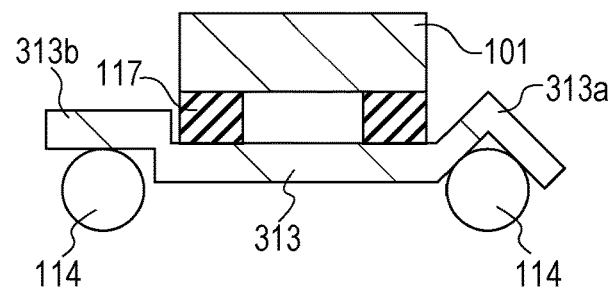

FIGS. 7A to 7C are diagrams illustrating the positional relationship between the attenuation member 117 and the fixing-side guide portions 313a and 313b. FIG. 7A is a diagram of the vibration wave motor 3 viewed from the friction member 101 in the Y-axis direction, that is, from the viewpoint opposite to that of FIG. 1A. FIG. 7B is a cross-sectional view taken along line VIIB-VIIB of FIG. 7A, and FIG. 7C is an enlarged diagram of FIG. 7B.

As illustrated in FIG. 7A, a fixed-side rail member 313 of the present embodiment has the fixing-side guide portions 313a and 313b in two rows, and a moving-side rail member 315 also has moving-side guide portions 315a and 315b in two rows. With this configuration, the relative movement of the vibrator 104 and the friction member 101 is guided at two places on a plane perpendicular to the Z-axis direction. This allows restricting the rotation of the friction member 101 and the vibrator 104 about the Z-axis.

As illustrated in FIG. 7C, the fixing-side guide portions 313a and 313b of the fixed-side rail member 313 protrude on the outside of the attenuation member 117 in the Y-axis direction. This prevents the interference of the attenuation member 117 and the fixed-side rail member 313, allowing attenuating the unwanted vibration of the friction member 101 which causes the warping of the fixed-side rail member 113 and abnormal noise and suppressing an increase in size due to the overlapping of components in the Y-axis direction.

Furthermore, the present embodiment does not need to have an opening in the attenuation member 117. Thus, even with the attenuation member 117 of the shape illustrated in FIG. 5E, the interference between the attenuation member 117 and the fixed-side rail member 313 can be avoided.

The first and second embodiments describe example configurations in which the attenuation member 117 has an opening or a cut-out portion, and the attenuation member 117 is divided so that the attenuation member 117 and the fixed-side rail member do not interfere with each other. However, even with a configuration in which the attenuation member 117 has no opening or no cut-out portion, and a configuration in which the attenuation member 117 is not divided, an increase in size due overlapping of components in the Y-axis direction can be restricted. For example, providing a groove recessed toward the fixed-side rail member at the position of the opening 117a illustrated in FIG. 5A so that the fixing-side guide member is fitted in the groove allows restricting an increase in size due overlapping of components in the Y-axis direction. In some embodiments, a groove is disposed at a position where the attenuation member 117 is not present in FIGS. 5B to 5D.

Next, an example of a driving apparatus that moves a driven object using the vibration wave motor 3 described in the first and second embodiments will be described.

Figure 8:
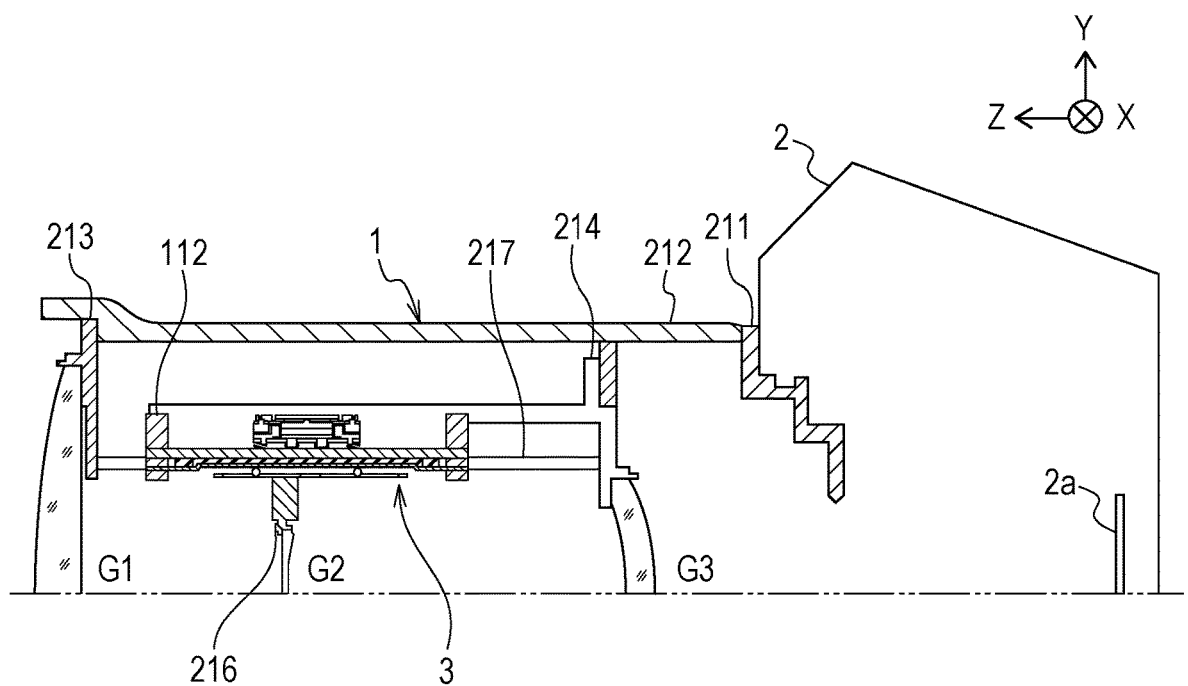
FIG. 8 is a diagram illustrating an example of a driving apparatus including the vibration wave motor.

FIG. 8 is a cross-sectional view of a lens barrel, which is an example of the driving apparatus using the vibration wave motor 3. FIG. 8 illustrates a configuration in which a lens barrel 1 including the vibration wave motor 3 is detachably attached to a camera body 2. In some embodiments, the image capturing apparatus has a configuration in which the lens barrel 1 is integral with the camera body 2. FIG. 8 illustrates only the upper half because the lens barrel 1 is substantially rotationally symmetric about the optical axis.

The camera body 2, which is an image capturing apparatus, is detachably fitted with the lens barrel 1 and includes an image sensor 2a therein. A mount 211 of the camera body 2 has a bayonet portion for attaching the lens barrel 1 to the camera body 2. The lens barrel 1 includes a fixed cylinder 212 which is in contact with a flange of the mount 211. The fixed cylinder 212 and the mount 211 are fixed together with screws (not illustrated). The fixed cylinder 212 is further fitted with a front barrel 213 that holds a lens G1 and a rear barrel 214 that holds a lens G3. The lens barrel 1 further includes a focus-lens holding frame 216 to hold a lens G2. The focus-lens holding frame 216 is held by a guide bar 217 retained by the front barrel 213 and the rear barrel 214 so as to move in a straight line. The fixing frame member 112 for the vibration wave motor 3 includes a flange (not illustrated) which is fixed to the rear barrel 214 with a screw or the like.

When the vibrator 104 of the vibration wave motor 3 moves, the driving power is transmitted to the focus-lens holding frame 216, which is a driven object, via the driving-power extracting unit of the movable frame member 107. The focus-lens holding frame 216 moves rectilinearly along the guide bar 217. Thus, the lens barrel 1 using the vibration wave motor 3 is configured.

The driving apparatus using the vibration wave motor 3 is not limited to the lens barrel but is applicable to an image capturing apparatus in which a holding frame that holds an image sensor is to be driven and a stage apparatus in which a stage is to be driven.

The first and second embodiments illustrate a configuration in which the vibrator 104 moves when the vibrator 104 vibrates. In some embodiments, the friction member 101 moves when the vibrator 104 vibrates. In this configuration, the moving-side member of the first embodiment is fixed, and the fixed-side member is moved, in which the attenuation member 117, the friction member 101, and the fixed-side rail members 113 and 313 move together, in which the driving-power extracting unit may be disposed at the fixing frame member 112 that fixes the friction member 101.

Other Example Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to example embodiments, it is to be understood that the disclosure is not limited to the disclosed example embodiments. The scope of the following claims is to be accorded the broadest interpretation so as to encompass all such modifications and equivalent structures and functions.

This application claims the benefit of Japanese Patent Application No. 2019-114941, filed Jun. 20, 2019, which is hereby incorporated by reference herein in its entirety.

What is claimed is:

1. A vibration wave motor comprising:
a vibrator including a piezoelectric device and a vibration plate;
a friction member;
a guide member configured to guide relative movement between the vibrator and the friction member;
a fixing member configured to fix the guide member at a first position and a second position in a direction of the relative movement between the vibrator and the friction member; and
an attenuation member held between the friction member and the guide member in a pressure direction in which the vibrator and the friction member are pressurized to contact each other at a location between the first position and the second position,
wherein the piezoelectric device is arranged to vibrate the vibration plate to move in the pressure direction relative to the friction member.

2. The vibration wave motor according to claim 1,
wherein the attenuation member is configured to urge the guide member in a first direction parallel to the pressure direction, away from the friction member, and to urge the friction member in a second direction opposite to the first direction, away from the guide member.

3. The vibration wave motor according to claim 2,
further comprising a pressure mechanism arranged to bring the vibrator and the friction member into pressure-contact with each other in the pressure direction,
wherein an urging force of the attenuation member urging the guide member in the first direction is arranged to balance with an urging force of the pressure mechanism urging the guide member in the second direction.

4. The vibration wave motor according to claim 1,
wherein the urging force of the attenuation member is generated at a predetermined position regardless of a positional change of the vibrator and the friction member due to the relative movement of the vibrator and the friction member.

5. The vibration wave motor according to claim 1,
wherein the attenuation member is configured to come into contact with antinodes of an out-of-plane bending vibration and antinodes of a torsional vibration of resonance of the friction member.

6. The vibration wave motor according to claim 1, wherein the attenuation member has an opening disposed in the pressure direction and extending in the direction of the relative movement.

7. The vibration wave motor according to claim 6, wherein the guide member includes a protruding portion protruding toward the attenuation member and extending in the direction of the relative movement, and wherein the protruding portion does not overlap with the attenuation member in the pressure direction.

8. The vibration wave motor according to claim 6, wherein part of the guide member enters the opening.

9. The vibration wave motor according to claim 8, further comprising a rolling member,
wherein the guide member is in contact with the rolling member on a surface opposite to a surface facing the attenuation member, and
wherein the opening overlaps with the rolling member in the pressure direction.

10. The vibration wave motor according to claim 1, wherein, the attenuation member has a groove recessed toward the guide member in the pressure direction, the groove extending in the direction of the relative movement.

11. The vibration wave motor according to claim 10, wherein part of the guide mechanism enters the groove.

12. The vibration wave motor according to claim 11, wherein the guide member is configured to be in contact with a rolling member at a surface opposite to a surface facing the attenuation member, and
wherein the groove overlaps with the rolling member in the pressure direction.

13. The vibration wave motor according to claim 1, wherein the attenuation member overlaps with part of the guide member in a direction of the relative movement and a direction perpendicular to the pressure direction.

14. The vibration wave motor according to claim 1, wherein the attenuation member has a higher vibration attenuation characteristic than the fixing member.

15. A driving apparatus comprising:
a vibration wave motor including:
 a vibrator including a piezoelectric device and a vibration plate;
 a friction member;
 a guide member configured to guide relative movement between the vibrator and the friction member;
 a fixing member configured to fix the guide member at a first position and a second position in a direction of the relative movement between the vibrator and the friction member; and
 an attenuation member held between the friction member and the guide member in a pressure direction in which the vibrator and the friction member are pressurized to contact each other at a location between the first position and the second position,
 wherein the piezoelectric device is arranged to vibrate the vibration plate to move in the pressure direction relative to the friction member; and
a driven object arranged to move with relative movement of the vibrator and the friction member.

16. The driving apparatus according to claim 15, wherein the driven object is a lens holding frame, a holding frame that holds an image sensor or a stage.

* * * * *